(12) United States Patent
Chiang et al.

(10) Patent No.: US 12,363,212 B2
(45) Date of Patent: Jul. 15, 2025

(54) MAGNETIC WALLET ACCESSORY

(71) Applicant: PopSockets LLC, Boulder, CO (US)

(72) Inventors: Randy Yang Chiang, San Francisco, CA (US); Lawrence Herman Fong, San Francisco, CA (US); Michael Kory, San Francisco, CA (US); David Czarnecki, San Francisco, CA (US); Vanessa Cantoli-Alves, San Francisco, CA (US); Andrew Heinrich, San Francisco, CA (US); John Roach, San Francisco, CA (US)

(73) Assignee: POPSOCKET LLC, Boulder, CO (US)

( * ) Notice: Subject to any disclaimer, the term of this patent is extended or adjusted under 35 U.S.C. 154(b) by 525 days.

(21) Appl. No.: 17/500,791

(22) Filed: Oct. 13, 2021

(65) Prior Publication Data

US 2022/0103667 A1 Mar. 31, 2022

Related U.S. Application Data

(63) Continuation-in-part of application No. 16/752,232, filed on Jan. 24, 2020, now Pat. No. 11,277,504, (Continued)

(51) Int. Cl.
*H04M 1/02* (2006.01)
*A45C 1/06* (2006.01)
(Continued)

(52) U.S. Cl.
CPC ............... *H04M 1/026* (2013.01); *A45C 1/06* (2013.01); *A45C 11/00* (2013.01); *A45C 11/182* (2013.01);
(Continued)

(58) Field of Classification Search
CPC .......... H04M 1/026; A45C 1/06; A45C 11/00; A45C 11/02; A45C 11/03; A45C 11/182;
(Continued)

(56) References Cited

U.S. PATENT DOCUMENTS 3,191,513 A 6/1965 Turner
4,601,361 A 7/1986 Nakada
(Continued)

FOREIGN PATENT DOCUMENTS

CN 101090617 B 12/2007
CN 201109605 Y 9/2008
(Continued)

OTHER PUBLICATIONS

Transmittal of the International Search Report and Written Opinion issued in PCT/US21/54833 on Jan. 24, 2022.

*Primary Examiner* — Wayne H Cai
(74) *Attorney, Agent, or Firm* — Irell and Manella LLP

(57) ABSTRACT

An accessory assembly for a mobile electronic device includes a platform, having a first side and an opposing second side. The platform includes one or more magnetic elements configured to magnetically attach the platform to a mobile electronic device or case along the first side. The accessory assembly also includes a wallet integrated with or attached to the second side of the platform, where the wallet is configured to hold one or more objects associated with a user of the accessory. The assembly also includes a grip accessory configured to attach to the wallet, where the grip accessory is configured to be handheld in order to support the accessory assembly and mobile electronic device when magnetically attached to the platform.

13 Claims, 9 Drawing Sheets

Related U.S. Application Data which is a continuation of application No. 16/225,914, filed on Dec. 19, 2018, now Pat. No. 10,673,997.

(60) Provisional application No. 63/091,298, filed on Oct. 13, 2020, provisional application No. 62/737,444, filed on Sep. 27, 2018, provisional application No. 62/614,829, filed on Jan. 8, 2018.

(51) Int. Cl.
*A45C 11/00* (2006.01)
*A45C 11/18* (2006.01)
*A45C 13/18* (2006.01)
*H05K 5/02* (2006.01)

(52) U.S. Cl.
CPC ......... *A45C 13/185* (2013.01); *H05K 5/0221* (2013.01); *H05K 5/023* (2013.01); *A45C 11/002* (2025.01); *A45C 11/003* (2025.01); *A45C 2200/15* (2013.01)

(58) Field of Classification Search
CPC ............ A45C 13/185; A45C 2011/002; H05K 5/0221; H05K 5/023
See application file for complete search history.

(56) References Cited

U.S. PATENT DOCUMENTS

| | | | |
|---|---|---|---|
| 4,915,540 A | 4/1990 | Kennedy et al. | |
| 4,955,493 A | 9/1990 | Touzani | |
| 5,568,549 A | 10/1996 | Wang | |
| 5,752,834 A | 5/1998 | Ling | |
| 6,736,285 B2 | 5/2004 | Stewart-Stand | |
| 6,771,329 B2 | 8/2004 | Hung et al. | |
| 7,778,023 B1 | 8/2010 | Mohoney | |
| 8,509,865 B1 | 8/2013 | LaColla | |
| 8,688,037 B2 | 1/2014 | Chatterjee et al. | |
| 8,757,374 B1 | 6/2014 | Kaiser | |
| 9,301,584 B2 | 4/2016 | Butts | |
| 9,397,719 B1 | 7/2016 | Schmidt | |
| 9,496,642 B1 | 11/2016 | Fan | |
| 10,113,691 B2 | 10/2018 | Grieve | |
| 10,200,518 B2 | 2/2019 | Richter | |
| 10,484,522 B1 | 11/2019 | McHatet | |
| 10,638,627 B1 | 4/2020 | Stime | |
| D883,273 S | 5/2020 | Chen | |
| 10,742,280 B2 | 8/2020 | Onggesanusi et al. | |
| 10,774,871 B1 | 9/2020 | Srour | |
| 10,897,984 B2 | 1/2021 | Roth | |
| 10,972,596 B1 | 4/2021 | Blau | |
| D921,359 S | 6/2021 | Roth | |
| D928,764 S | 8/2021 | Yeo | |
| 11,274,697 B2 | 3/2022 | Srour | |
| 2005/0277092 A1 | 12/2005 | Hwang | |
| 2007/0279852 A1 | 12/2007 | Daniel | |
| 2008/0315990 A1 | 12/2008 | Komatsu | |
| 2010/0038514 A1 | 2/2010 | Yu | |
| 2010/0222110 A1 | 9/2010 | Kim et al. | |
| 2010/0321899 A1 | 12/2010 | Vossoughi et al. | |
| 2011/0036876 A1 | 2/2011 | Fathoullahi | |
| 2012/0042476 A1 | 2/2012 | Karmatz | |
| 2012/0043452 A1 | 2/2012 | Karmatz | |
| 2012/0138647 A1 | 6/2012 | Norling | |
| 2013/0003984 A1 | 1/2013 | Belfonte et al. | |
| 2013/0039015 A1 | 2/2013 | Li | |
| 2013/0177304 A1 | 7/2013 | Chapman | |
| 2015/0029352 A1 | 1/2015 | Burciaga | |
| 2015/0076020 A1* | 3/2015 | Smith .................... A45C 11/00 206/320 |
| 2015/0144754 A1 | 5/2015 | ElHarar | |
| 2015/0354747 A1 | 12/2015 | Jennings | |
| 2016/0069512 A1 | 3/2016 | Grieve | |
| 2016/0070156 A1 | 3/2016 | Alster | |
| 2016/0166056 A1 | 6/2016 | Le | |
| 2016/0249472 A1 | 8/2016 | Tu | |
| 2016/0373152 A1 | 12/2016 | Schmidt | |
| 2017/0108167 A1 | 4/2017 | Fan | |
| 2017/0195000 A1 | 7/2017 | Srour | |
| 2018/0051851 A1 | 2/2018 | Hobbs | |
| 2018/0146078 A1 | 5/2018 | Shin | |
| 2018/0262603 A1 | 9/2018 | Richter | |
| 2018/0335178 A1 | 11/2018 | Bin et al. | |
| 2018/0348541 A1 | 12/2018 | Radzwill | |
| 2019/0281961 A1 | 9/2019 | Peterson | |
| 2020/0093231 A1 | 3/2020 | Mora et al. | |
| 2020/0162594 A1 | 5/2020 | Cantoli-Alves et al. | |
| 2020/0299030 A1 | 9/2020 | Fromme | |
| 2020/0326030 A1 | 10/2020 | Surani et al. | |
| 2020/0328017 A1 | 10/2020 | Isenberg | |
| 2020/0329133 A1* | 10/2020 | Surani .................... A45F 5/00 |
| 2021/0231970 A1 | 7/2021 | Radzwill | |
| 2022/0087389 A1* | 3/2022 | Wulff .................... H01F 7/02 |
| 2022/0103367 A1 | 3/2022 | Yalagandula | |

FOREIGN PATENT DOCUMENTS

| | | |
|---|---|---|
| CN | 101512459 B | 8/2009 |
| CN | 106979448 A | 7/2017 |
| JP | H1155378 A | 2/1999 |
| WO | 2011035512 A1 | 3/2011 |
| WO | 2012016158 A2 | 2/2012 |
| WO | 2012125690 A1 | 9/2012 |
| WO | 2015036728 A1 | 3/2015 |
| WO | 2017044622 A1 | 3/2017 |
| WO | 2018035349 A1 | 2/2018 |
| WO | 2020/154702 A1 | 7/2020 |
| WO | 2021154760 A1 | 8/2021 |

* cited by examiner

MAGNETIC WALLET ACCESSORY

CROSS-REFERENCE TO RELATED APPLICATIONS

This application is a continuation-in-part of U.S. Application No. claims the benefit of U.S. application Ser. No. 16/752,232, filed on Jan. 24, 2020, which in turn is a continuation of U.S. application Ser. No. 16/225,914, filed on Dec. 19, 2018, which claims the benefit of U.S. Provisional Application No. 62/737,444, filed on Sep. 27, 2018 and U.S. Provisional Application No. 62/614,829, filed on Jan. 8, 2018, the entire disclosures of which are hereby incorporated by reference. This application also claims the benefit of U.S. Provisional Application No. 63/091,298, filed on Oct. 13, 2020.

FIELD OF THE DISCLOSURE

The present disclosure relates to accessories for mobile electronic devices, particularly an accessory that includes a wallet that is removably attachable to a mobile electronic device or a case for the mobile electronic device.

BACKGROUND

U.S. Pat. No. 8,560,031 discloses extendable socket accessories, formed of accordion-like socket structures and having buttons attached at their distal ends, for attaching to mobile electronic devices or cases for mobile electronic devices. When attached, the extendable socket accessories can be used to grip the mobile electronic device (and/or the case), as a stand for the mobile electronic device (and/or the case), and to manage cords associated with the electronic device.

However, there is a need in the art for an accessory assembly that integrates the functionality of a wallet and a grip accessory that facilitates one-handed use, but without the need to be permanently or semi-permanently attached to a mobile electronic device.

SUMMARY

The disclosure relates to an accessory assembly for a mobile electronic device that includes a platform, having a first side and an opposing second side. The platform includes one or more magnetic elements configured to magnetically attach the platform to a mobile electronic device or case along the first side. The accessory assembly also includes a wallet integrated with or attached to the second side of the platform, where the wallet is configured to hold one or more objects associated with a user of the accessory. The assembly also includes a grip accessory configured to attach to the wallet, where the grip accessory is configured to be handheld in order to support the accessory assembly and mobile electronic device when magnetically attached to the platform.

DETAILED DESCRIPTION OF THE EXEMPLARY EMBODIMENTS

The present disclosure relates to accessories for mobile electronic devices (e.g., smartphones, tablet computers, electronic readers, digital media players, cameras, and other mobile electronic devices). The accessories disclosed herein generally include a wallet that is removably attachable to a mobile electronic device or a case for the mobile electronic device. The wallet is configured to securely hold one or more objects (e.g., credit cards, identification cards, business cards, pictures, cash, keys, or the like) associated with (e.g., owned by) a user of the accessory (in many cases, the user will be using the mobile electronic device as well). Thus, when the wallet is attached to the mobile electronic device or the case therefor, the user can securely and easily store and carry such objects along with his/her mobile electronic device. At the same time, the wallet can be removed from the mobile electronic device (or the case) when desired (e.g., to reduce the profile of the mobile electronic device, in order to enable wireless charging).

Figure 1:
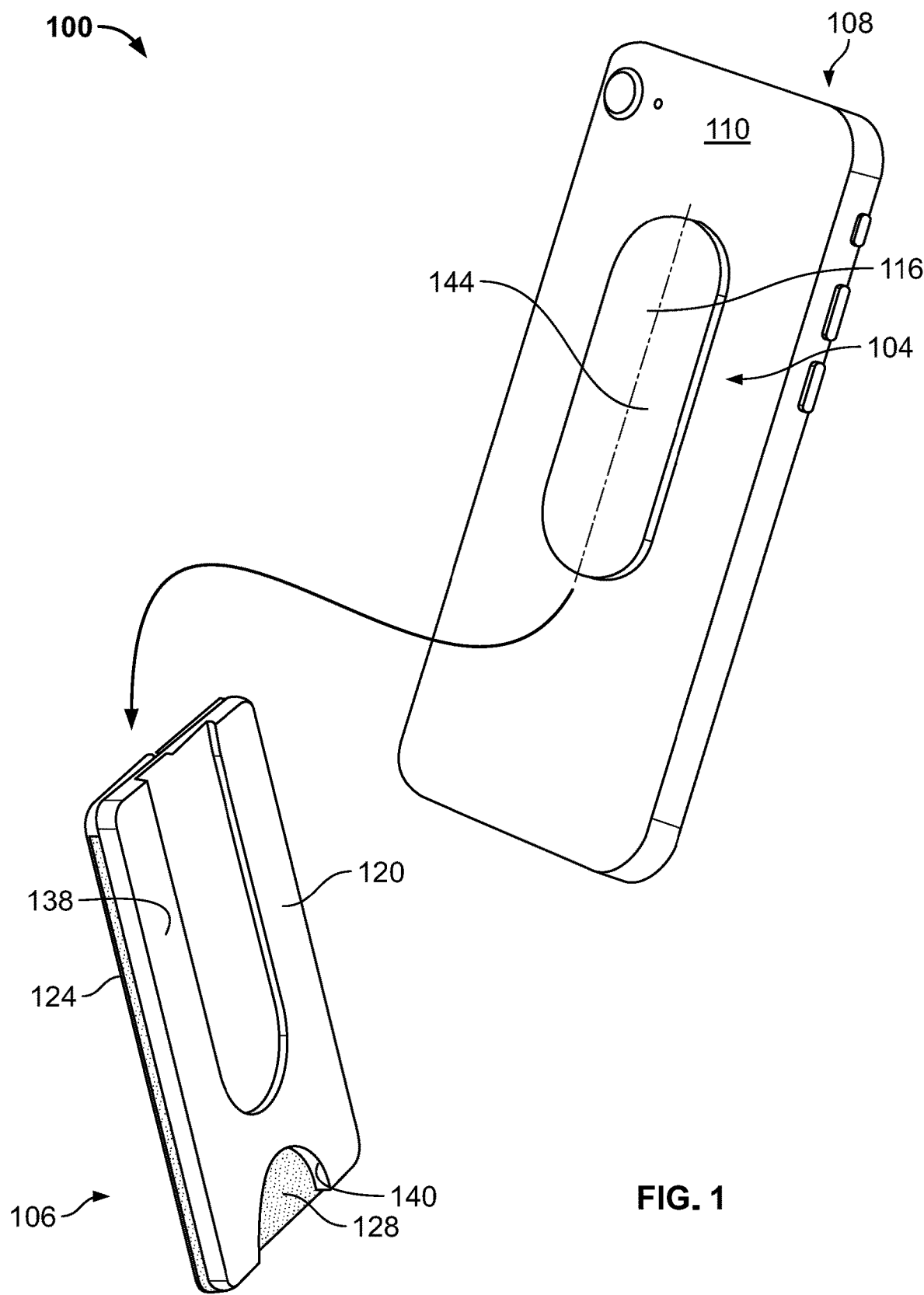
FIG. 1 is a perspective view of one example of a wallet accessory for a mobile electronic device constructed in accordance with the teachings of the present disclosure, with a platform of the accessory attached to the mobile electronic device and a wallet of the accessory removed from the platform.
Figure 2:
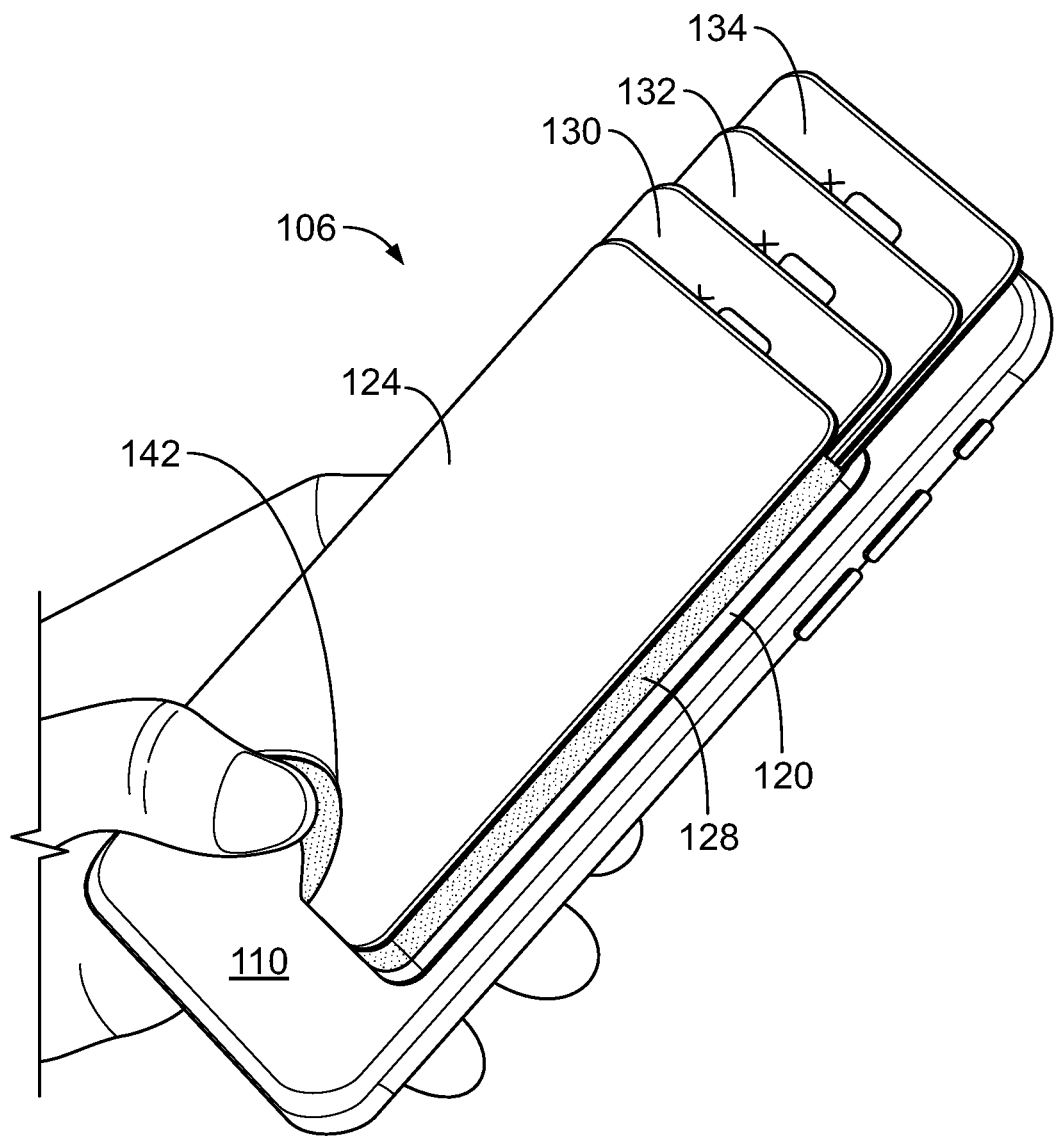
FIG. 2 is a perspective view of a wallet accessory attached to the platform.
Figure 3:
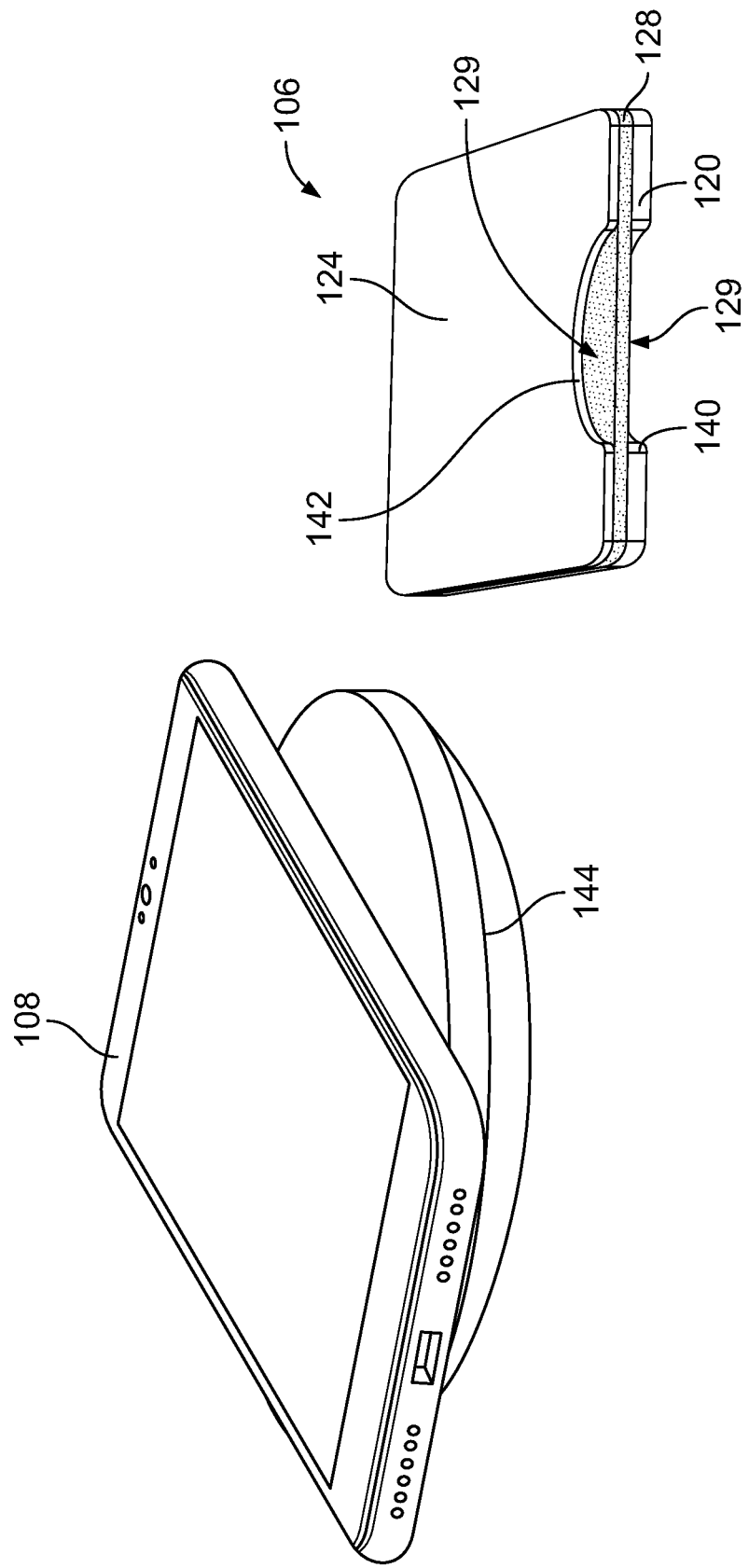
FIG. 3 is similar to FIG. 1, but shows the wallet removed from the platform for charging the mobile electronic device using a wireless charging device.

FIGS. 1-3 illustrate one example of an accessory assembly 100 constructed in accordance with the present disclosure. The accessory assembly 100 in this example includes a platform 104 and a wallet 106 that is removably attachable to the platform 104 and is generally configured to securely hold one or more objects for a user of the accessory assembly 100. In other examples, the accessory assembly 100 may include additional and/or different components.

In FIGS. 1-3, the platform 104 is shown as being removably attached to a mobile electronic device in the form of a mobile electronic device 108. The platform 104 is removably attached to a rear surface 110 of the mobile electronic device 108 via a securing element (not shown). The securing element preferably takes the form of a magnetic attachment such that the securing element securely attaches the platform 104 to the mobile electronic device 108, but also allows the platform 104 to be detached and repositioned or replaced if necessary.

In other examples, however, the platform 104 may instead be removably attached to a case for the mobile electronic device 108 or a different mobile electronic device. In yet other examples, the platform 104 may be permanently attached to or integrally formed with the mobile electronic device 108 or may be permanently attached to or integrally formed with a case for a mobile electronic device. When the platform 104 is permanently attached to or integrally formed with a case, the accessory 100 may be considered to include the case as well.

As best illustrated in FIGS. 1 and 3, the platform 104 in this example is an oval-shaped structure that has the first surface described above (but not shown) and a second surface 116 that is disposed opposite the first surface. It will be appreciated that the second surface 116 faces away from the mobile electronic device 108 when the platform 104 is attached to the mobile electronic device 108. In other examples, however, the platform 104 can have a different shape and/or size. For example, the platform 104 can have a rectangular, triangular, circular, hexagonal, octagonal, irregular, or other shape.

As illustrated, the wallet 106 in this example generally includes a first panel 120, a second panel 124 opposite the first panel 120, and an elastic element 128 that is coupled to the first and second panels 120, 124 so as to define one or more storage compartments for holding one or more objects (e.g., credit cards 130, 132, 134). In this example, the elastic element 128 is disposed between and fixedly attached to the first panel 120 and the second panel 124, thereby connecting the first and second panels 120, 124 but also defining two storage compartments 129 for holding one or more objects, as illustrated in FIG. 3. In other examples, the elastic element 128 may only be disposed between and fixedly attached to and disposed between edges of the first and second panels 120, 124, thereby connecting the first and second panels 120, 124, but only defining a single storage compartment.

The first panel 120 is preferably made of a rigid material (e.g., a hard plastic), though the first panel 120 can be made of a semi-rigid material or a flexible material. The first panel 120 includes a recess 138 that is formed only partially through the first panel, as is best illustrated in FIGS. 1 and 3. The recess 138 generally has a shape that conforms to the shape of the platform 104, such that the recess 138 is configured to removably receive and retain the platform 104. Thus, the recess 138 in this example has a U-shape that is sized to removably receive and retain the platform 104, which in this example is oval shaped. In other examples, e.g., when the platform 104 has a different size and/or shape, the recess 138 may have a different size and/or shape that conforms to this differently sized and/or shaped platform. The first panel 120 also includes a cutout 140 that allows the user to guide objects into or out of one or both of the storage compartments 129. Like the first panel 120, the second panel 124 is preferably made of a rigid material (e.g., a hard plastic), though it too can be made of a semi-rigid material or a flexible material. The second panel 124 also includes a cutout 142 (which is identical to the cutout 140), but the second panel 124 is otherwise solid, i.e., it does not include a recess.

Meanwhile, the elastic element 128 in this example takes the form of an elastic sock that is made of a material that is flexible but is also rigid enough to retain its shape. In other words, the elastic element 128 is made of a material that permits user manipulation of the elastic element 128, e.g., when the user is inserting objects into or removing objects from the storage compartments 129, but biases the elastic element 128 back to its original position shown in FIGS. 1 and 3 when the elastic element 128 is released.

In other examples, the wallet 106 may include additional, fewer, and/or different components. As an example, the wallet 106 may employ a rigid element instead of the elastic element 128 to connect the first and second panels 120, 124. As another example, the wallet 106 may not include the cutout 140 and/or the cutout 142.

As discussed above, the wallet 106 is removably attachable to the platform 104. Thus, when desired (e.g., when the user wishes to carry the wallet 106 and any objects stored therein with the mobile electronic device 108), the wallet 106 can be attached to the platform 104, as illustrated in FIG. 2. In this example, the wallet 106 can be attached to the platform 104 by manipulating the wallet 106 so that the recess 138 of the wallet 106 slidably receives the platform 104 along a longitudinal axis 144 of the platform 104. Conversely, when desired, the wallet 106 can be detached from the platform 104 in a similar but opposite manner, as illustrated in FIGS. 1 and 3. As an example, the user may wish to detach the wallet 106 in order to reduce the profile of the mobile electronic device 108, to remove objects from the wallet 106, or to charge the mobile electronic device 108 using the wireless charger device 144 shown in FIG. 3. In any case, in this example, the wallet 106 can be detached from the platform 104 by manipulating the wallet 106 so that the platform 104 slides out of the recess 138 along the longitudinal axis 144. In other examples, the wallet 106 can be attached to or detached from the platform 104 in a different manner. As an example, the wallet 106 can be removably attached to the platform 104 using a magnetic coupling, as described in more detail below.

Figure 4:
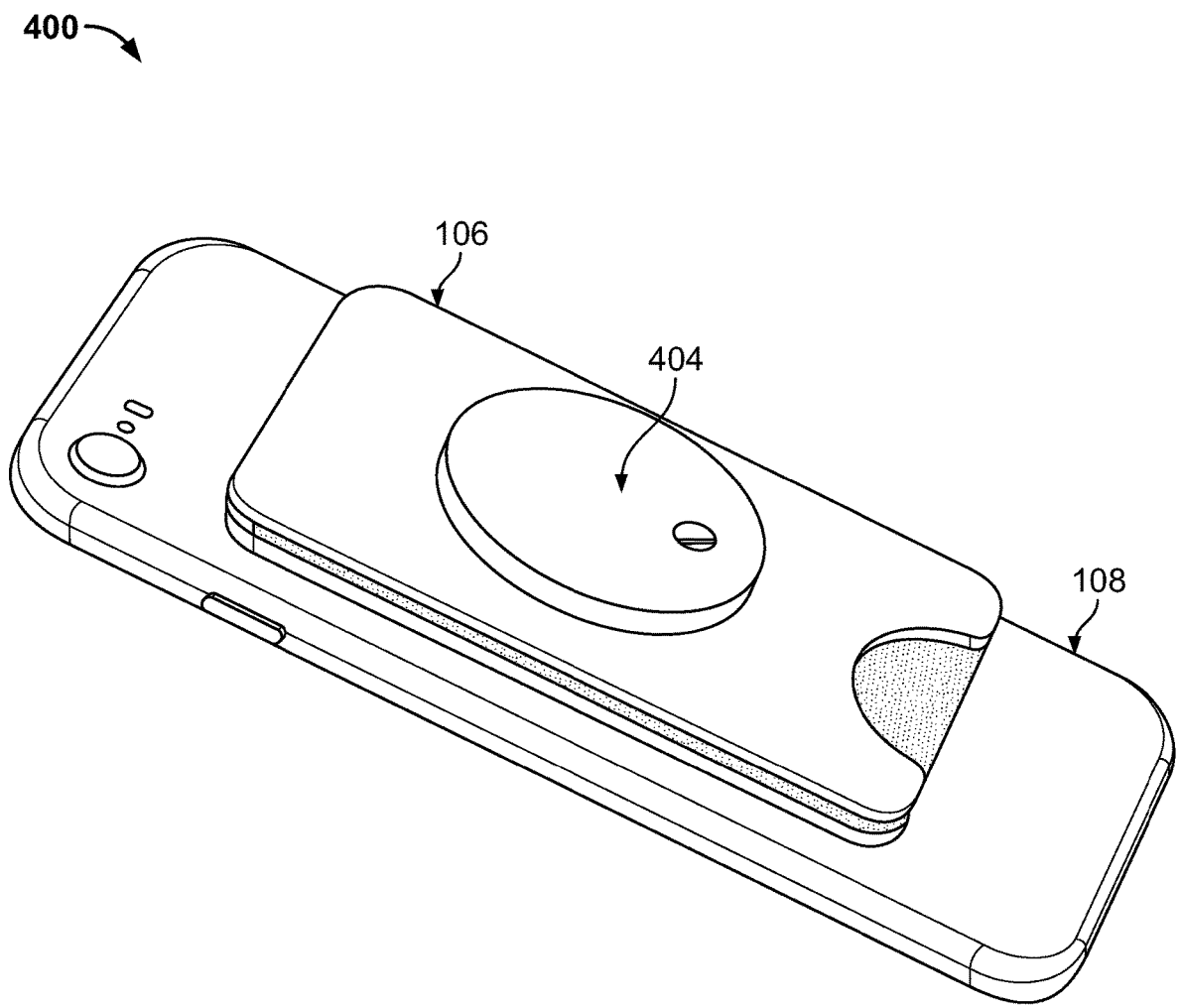
FIG. 4 is a perspective view of another example of an accessory for a mobile electronic device constructed in accordance with the teachings of the present disclosure.
Figure 5:
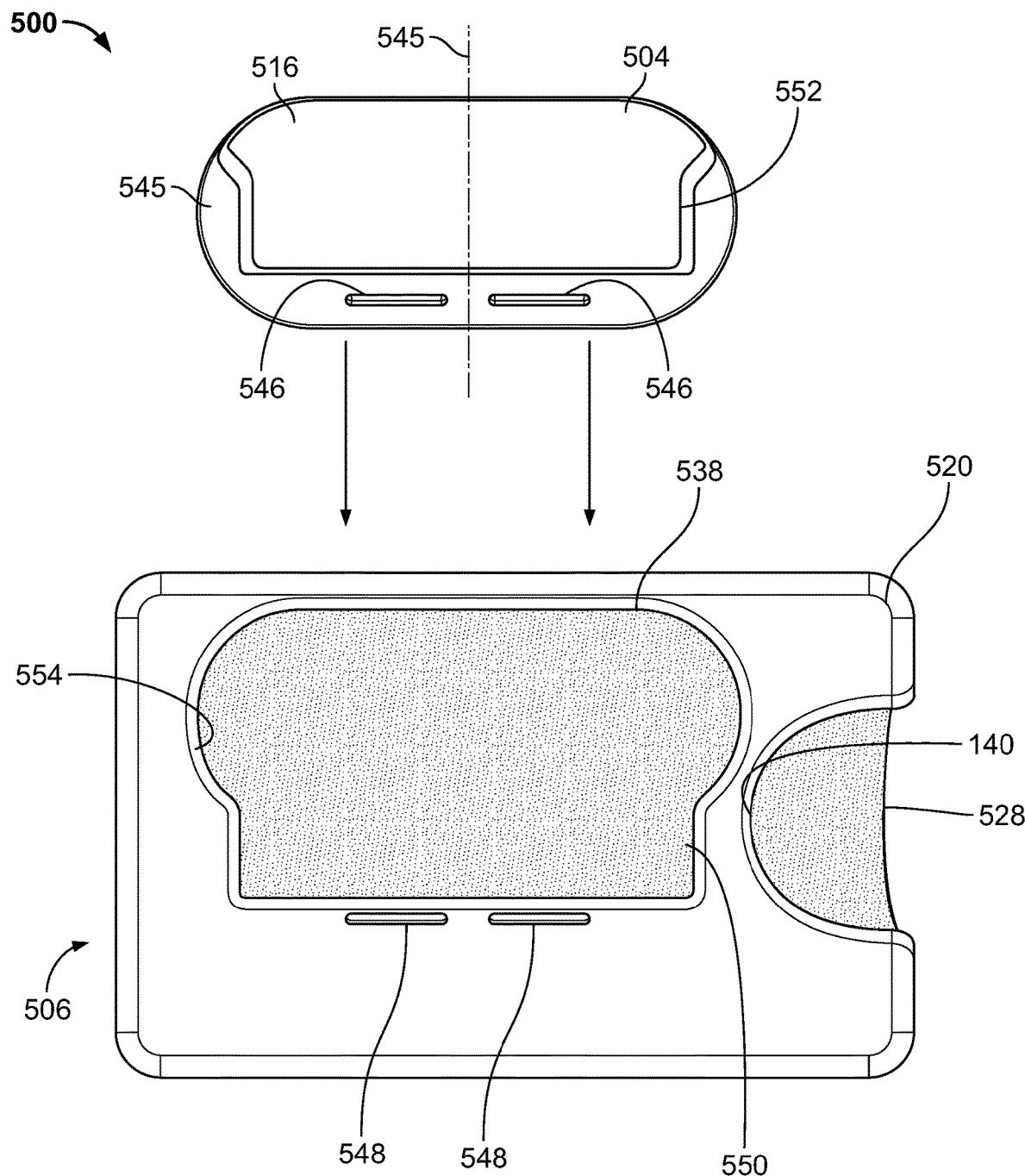
FIG. 5 is a top view of another example of an accessory for a mobile electronic device constructed in accordance with the teachings of the present disclosure, with a wallet of the accessory removed from a platform of the accessory.
Figure 6:
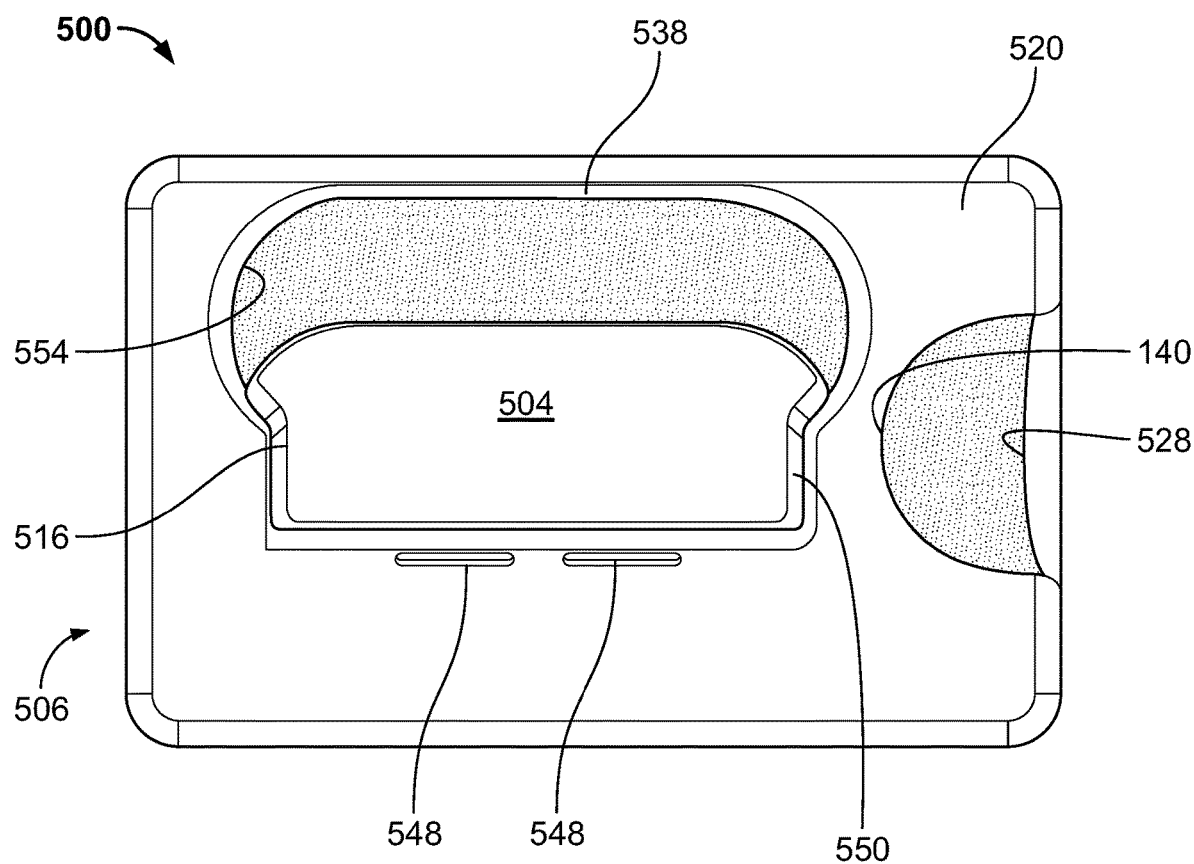
FIG. 6 is a top view of the accessory of FIG. 5, but with the wallet attached to the platform.

FIG. 4 illustrates another example of an accessory assembly 400 constructed in accordance with the present disclosure. The accessory assembly 400 is similar to the accessory assembly 100, with common components illustrated using common reference characters, but also includes a grip accessory 404 that may be removably attached to, permanently attached to, or integrally formed with the wallet 106. Further description of such grip accessories, which can be used, for example, as a docking accessory and for use as a grip and stand for a mobile electronic device, can be found in commonly owned U.S. Pat. No. 8,560,031, the entire disclosure of which is hereby incorporated by reference herein. In other embodiments, however, grip accessory 404 may be implemented using structures. For example, grip accessory may be implemented using a ring that is hingeably attached to the wallet 106 such that a user is able to engage the accessory by inserting one or more fingers into an inner opening forming the ring. Other examples of structures which may be used to form accessory 404 include elastic loop straps or hinged lever kickstands. In each case, it should be appreciated that the grip accessory 404 is structured to provide a means by which a user can grasp, hold and support a mobile electronic device using a single hand FIGS. 5 and 6 illustrate another example of an accessory assembly 500 constructed in accordance with the present disclosure. The accessory assembly 500 is similar to the accessory assembly 100, with common components illustrated using common reference characters, but differs in the manner described below.

First, the platform 504, while otherwise similar, has a structure that is different from the platform 104. Like the platform 104, the platform 504 has an oval-shape. However, unlike the platform 104, the platform 504 includes a recessed portion 545 (recessed relative to the second surface 516, which, like the second surface 116, faces outward, away from the mobile electronic device 108 when the platform 504 is attached to the mobile electronic device 108) and plurality of teeth 546 that extend outward from the recessed portion 545 at or proximate to a perimeter edge of the platform 504. In this example, the plurality of teeth 546 extend outward, away from the mobile electronic device 108 when the platform 504 is attached to the mobile electronic device 108.

Second, the wallet 506 has a structure that is different from the wallet 106. In particular, the wallet 506 includes a recess 538 that is different from the recess 138. The recess 538, like the recess 138, generally has a shape that conforms to the shape of the platform 504, such that the recess 538 is configured to removably receive and retain the platform 504. However, the recess 538, unlike the recess 138, includes a channel 550 that opens into an oval-shaped portion 554. The channel 550 is generally configured to slidably receive the first surface 516 of the platform 504, which has a substantially rectangular profile. In this example, the channel 550 is a rectangular channel that receives the first surface 516. However, it should be noted that the channel 550 and the first surface 516 may instead take a different shape (e.g., a circular shape). Moreover, the wallet 506 also includes a plurality of slots 548 formed adjacent the channel 550 of the wallet 506 to receive the plurality of teeth 546 of the platform 504.

Further, the wallet 506 is coupled to the platform 504 in a different manner than the wallet 106 is coupled to the platform 104. Like the wallet 106, the wallet 506 can be releasably attached to the platform 504 by manipulating the wallet 506 so that the recess 538 of the wallet 506 slidably receives the platform 504. However, unlike the wallet 106, the wallet 506 is manipulated so that the recess 538 slidably receives the platform 504 along a transverse axis 545 of the platform 504, as illustrated in FIG. 5. In other words, the wallet 506 is slidable in a horizontal direction to dispose the platform 504 in the recess 538, rather than in a vertical direction (as is the case to dispose the platform 104 in the recess 138). The plurality of teeth 546 are then moved into engagement with the plurality of slots 548 in the wallet 506 (e.g., by snapping the teeth 546 in the slots 548), as illustrated in FIG. 6, thereby securely attaching the platform 504 to the wallet 506 (and vice-versa). In other examples, however, the platform 504 may be securely attached to the wallet 506 by other mechanical locking means (e.g., threads, hook and loop fastening means). Conversely, when desired, the wallet 506 can be detached from the platform 504 in a similar but opposite manner.

Finally, while not illustrated herein, it will be appreciated that a grip accessory such as the grip accessory 404 may be removably attached to, permanently attached to, or integrally formed with the wallet 506.

Figure 7:
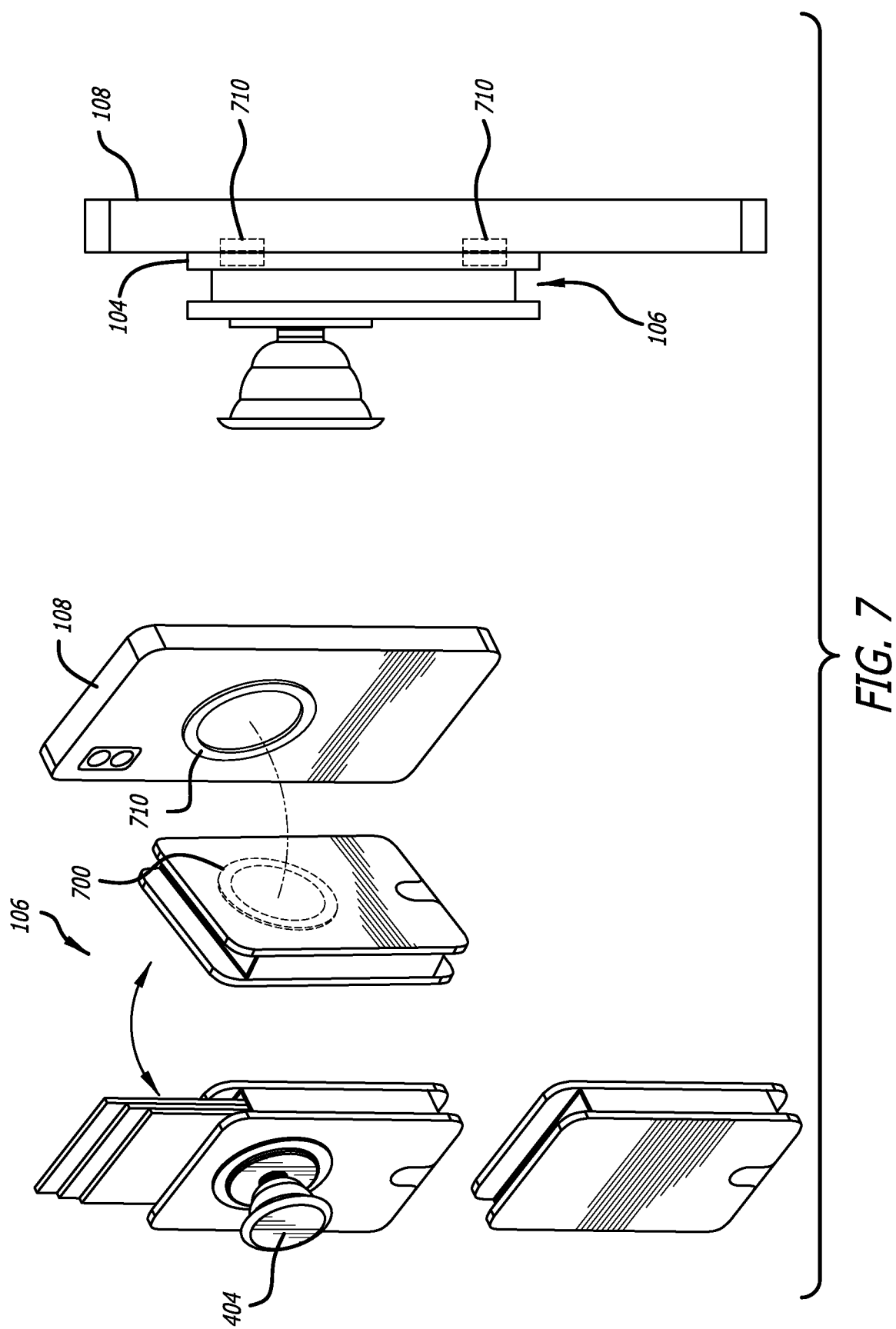
FIG. 7 depicts one aspect of the present disclosure in which the wallet is attachable to an electronic mobile device by way of a magnetic coupling.

Referring now to FIG. 7, depicted is one embodiment of wallet 106 in which the securing element 700 is in the form of one or more magnetic elements (e.g., one or more magnets or metallic components (e.g., steel rings)) which are integrated into the platform 104, and where the wallet 106 is further integrated with or otherwise securely connected to the platform 104. In this example, the platform is dimensioned in accordance with the dimensions of the wallet 106 and may be comprised of a backing or rear panel of the wallet 106. Also, in this example, mobile electronic device 108 comprises one or more integrated magnet(s) 710. As such, the wallet 106 is configured to be magnetically attached to the device 108 when brought within a sufficient close proximity that a magnetic attraction forms between securing element 700 and the integrated magnet(s) 710 of the device 108. As shown, the wallet 106 may be configured with or without the aforementioned grip accessory 404.

Figure 8B:
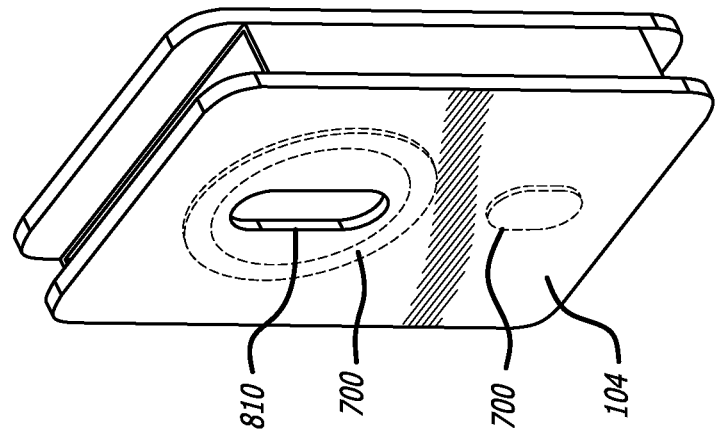
FIG. 8A-8B depict another example of a wallet configured to be attachable to an electronic mobile device by way of a magnetic coupling.
Figure 8A:
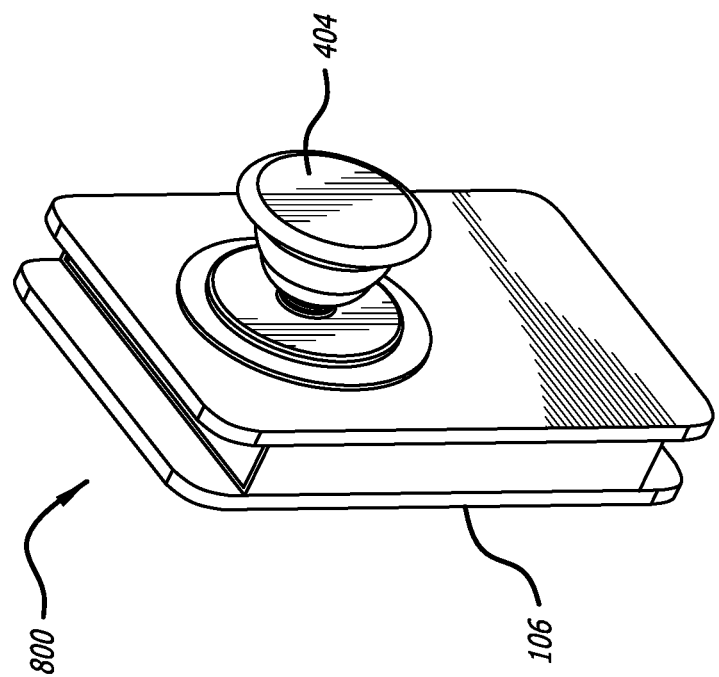

FIGS. 8A-8B depict another configuration of the accessory assembly 800 in which a wallet 106 is shown with a grip accessory 404 and magnetic platform 104, as described above. In particular, FIG. 8A depicts an exterior side of the wallet 106 with attached grip accessory 404. In this embodiment, the wallet does not include a cutout, as described above. FIG. 8B depicts an interior side of the assembly 800 in which the securing element 700 comprises a ring-based portion and a separate alignment portion, each of which can be comprised of metal or magnets. The alignment portion may be used to ensure parallel alignment between the phone/case and wallet. In this embodiment, the securing element 700 is integrated with the platform 104, where the platform 104 comprises a backing or rear panel of the wallet 106. As such, the wallet 106 may be magnetically attachable to a mobile electronic device or case when the platform 104 is brought within close proximity to a mobile device or case equipped with one or more magnetic elements, as described above.

In this embodiment, objects (e.g., cards) are not accessible while the wallet is attached to a device or case. Instead, the wallet may be removed from the mobile electronic device or case to reveal a "finger push" area 810. From there, objects within the wallet 106 may be engaged and pushed upward. This direction eliminates cutouts from the front face, potentially allowing for more uniform RFID-shielding.

Figure 9B:
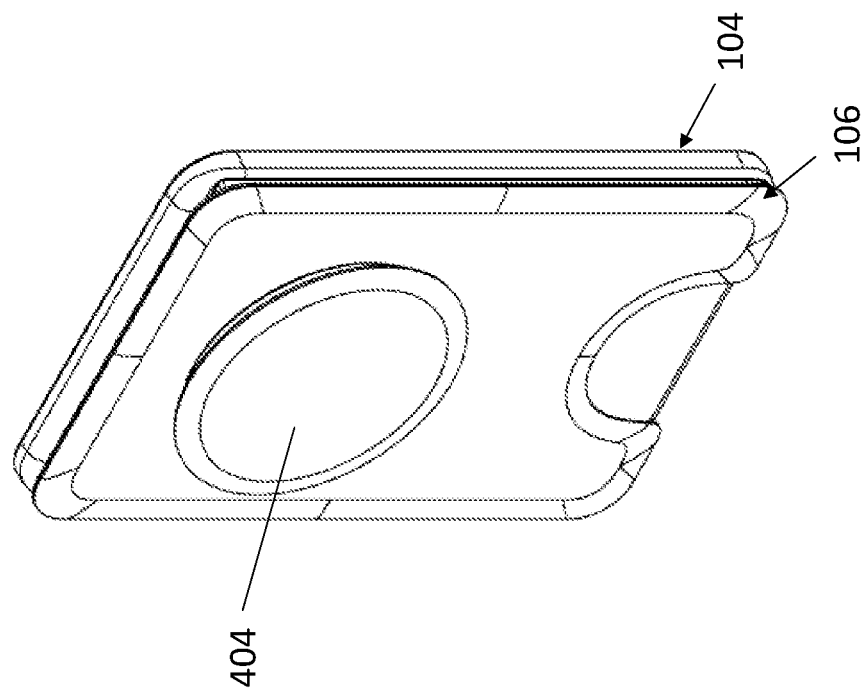
FIG. 9A-9B depict another example of a wallet configured to be attachable to an electronic mobile device by way of a magnetic coupling.
Figure 9A:
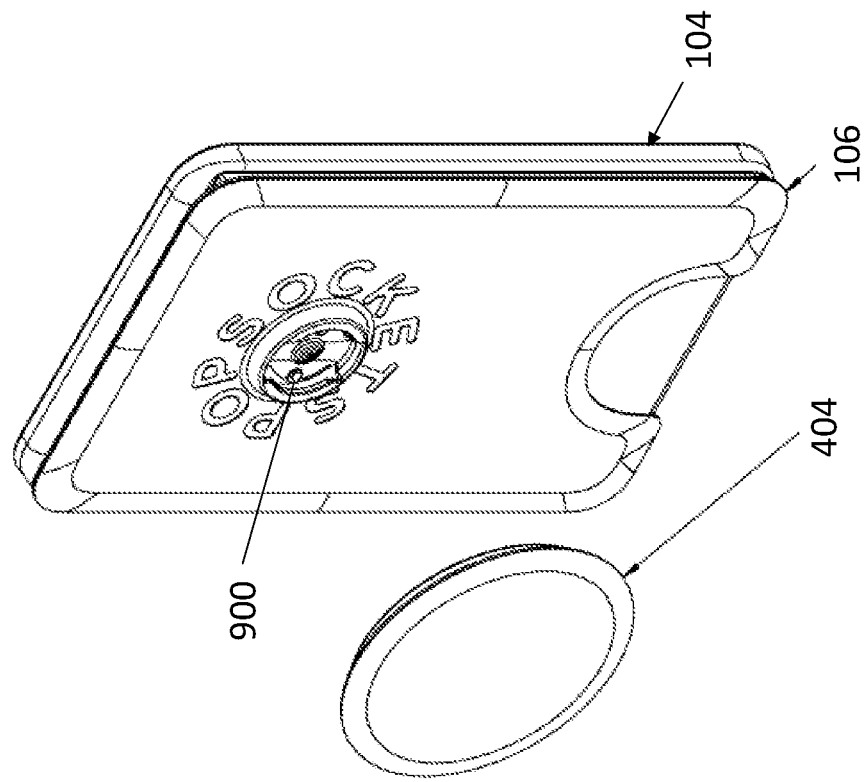

Referring now to FIGS. 9A-9B, depicted is another example in which the grip accessory 404 (shown in a collapsed configuration) is swappable from the wallet 106, such as by rotating the grip accessory 404 relative to the wallet 106 in an engaging and disengaging manner. In one embodiment, the grip accessory 404 is configured to engage with a corresponding engagement mechanism 900 that is integrated into the wallet 106, as shown in FIG. 9A. In one example, the swappable grip accessory 404 and engagement mechanism 900 may be configured in accordance with the various locking and connection-related mechanisms described in U.S. Pat. No. 10,348,352, filed on May 30, 2018, the entire disclosure of which is hereby incorporated by reference. However, other attachment mechanisms may similarly be used, including annular snaps, T-channels, hook and loop fasteners, etc.

FIG. 9A depicts the grip accessory 404 detached from the engagement mechanism 900 and wallet 106, while FIG. 9B depicts the grip accessory 404 in an attached state. Moreover, the platform 104 of FIGS. 9A-9B is substantially similar to the platform 104 of FIGS. 8A-8B described above.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of various embodiments. This description should be read to include one or at least one and the singular also includes the plural unless it is obvious that it is meant otherwise.

It will be appreciated that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. The same reference numbers may be used to describe like or similar parts. Further, while several examples have been disclosed herein, any features from any examples may be combined with or replaced by other features from other examples. Moreover, while several examples have been disclosed herein, changes may be made to the disclosed examples within departing from the scope of the claims.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

What is claimed is:

1. An accessory assembly for a mobile electronic device comprising:
    a platform, having a first side and an opposing second side, the platform comprising one or more magnetic elements configured to magnetically attach the platform directly or indirectly to a mobile electronic device along the first side;
    a wallet integrated with or attached to the second side of the platform, wherein the wallet is configured to hold one or more objects associated with a user of the accessory assembly; and
    a grip accessory configured to attach to the wallet, wherein the grip accessory is configured to be handheld to support the accessory assembly and mobile electronic device when magnetically attached to the platform,
    wherein an external side of the wallet opposite the platform is configured with an accessory recess area into which a portion of the grip accessory is received,
    wherein a base of the grip accessory is secured to the wallet within the accessory recess area, and
    wherein the accessory recess area is recessed with respect to at least a portion of the external side of the wallet circumscribing the circular region.

2. The accessory assembly of claim 1, wherein the one or more magnetic elements comprises one or more individual magnets.

3. The accessory assembly of claim 1, wherein the one or more magnetic elements are configured to attach the platform to a mobile electronic device that comprises at least one integrally-formed magnet.

4. The accessory assembly of claim 1, wherein the grip accessory is configured to be detachably attached to the wallet by an attachment mechanism.

5. The accessory assembly of claim 1, wherein the grip accessory comprises one of a ring, accordion, elastic loop strap, or hinged lever kickstand structure.

6. The accessory assembly of claim 1, wherein the wallet comprises a first panel and a second panel that together define one or more storage compartments sized to hold the one or more objects associated with the user of the accessory.

7. The accessory assembly of claim 6, wherein the wallet further comprises an elastic element connecting the first and second panels.

8. The accessory assembly of claim 6, wherein the first panel and the second panel each include a first end, a second end opposite the first end, and first and second edges extending between the first end and the second end.

9. The accessory assembly of claim 8, wherein an elastic element connects the first and second edges of the second panel to at least a part of the first and second edges, respectively, of the first panel.

10. The accessory assembly of claim 9, wherein the elastic element defines a plurality of storage compartments sized to hold the one or more objects.

11. The accessory assembly of claim 6, further comprising a cutout that extends through at least one of the first panel and the second panel.

12. The accessory assembly of claim 1, wherein the one or more magnetic elements form an annular shape, and wherein the platform further comprises an alignment magnet arranged separate from the annular shape formed by the one or more magnetic elements.

13. The accessory assembly of claim 1, wherein the accessory recess area comprises a circular region.

* * * * *

UNITED STATES PATENT AND TRADEMARK OFFICE
CERTIFICATE OF CORRECTION

PATENT NO. : 12,363,212 B2
APPLICATION NO. : 17/500791
DATED : July 15, 2025
INVENTOR(S) : Randy Yang Chiang et al.

Page 1 of 1

It is certified that error appears in the above-identified patent and that said Letters Patent is hereby corrected as shown below:

In the Claims

In Claim 1, at Column 8, Line 8, the word "the" should read --a--.

In Claim 13, at Column 8, last line, the word "a" before circular region should read --the--.

Signed and Sealed this
Twelfth Day of August, 2025

Coke Morgan Stewart
*Acting Director of the United States Patent and Trademark Office*